US009047987B2

(12) United States Patent  (10) Patent No.: US 9,047,987 B2
Schade  (45) Date of Patent: Jun. 2, 2015

(54) MULTIPLE ACCESS TEST ARCHITECTURE FOR MEMORY STORAGE DEVICES

(75) Inventor: Peter Arthur Schade, Fremont, CA (US)

(73) Assignee: INTERNATIONAL MICROSYSTEMS, INC., Milpitas, CA (US)

( * ) Notice: Subject to any disclaimer, the term of this patent is extended or adjusted under 35 U.S.C. 154(b) by 303 days.

(21) Appl. No.: 12/503,000

(22) Filed: Jul. 14, 2009

(65) Prior Publication Data

US 2010/0023818 A1 Jan. 28, 2010

Related U.S. Application Data

(60) Provisional application No. 61/082,599, filed on Jul. 22, 2008.

(51) Int. Cl.
*G11C 29/08* (2006.01)
*G06F 13/10* (2006.01)
*G11C 29/56* (2006.01)

(52) U.S. Cl.
CPC ............. *G11C 29/08* (2013.01); *G06F 13/102* (2013.01); *G06F 2213/0042* (2013.01); *G11C 29/56* (2013.01); *G11C 2029/5602* (2013.01)

(58) Field of Classification Search
CPC .......... G06F 13/102; G06F 2213/0042; G11C 29/08; G11C 29/56; G11C 2029/5602
USPC ......................................................... 710/74
See application file for complete search history.

(56) References Cited

U.S. PATENT DOCUMENTS

| 6,460,152 | B1 | 10/2002 | Demidov et al. |
| 6,490,685 | B1 | 12/2002 | Nakamura |
| 7,137,037 | B2 | 11/2006 | Kuo et al. |
| 7,356,737 | B2 | 4/2008 | Cowell et al. |
| 7,440,886 | B2 | 10/2008 | Bress et al. |
| 7,480,582 | B2 | 1/2009 | Chen |
| 7,493,437 | B1 | 2/2009 | Jones et al. |
| 7,793,014 | B2 * | 9/2010 | Paley et al. ...................... 710/36 |
| 7,987,308 | B2 * | 7/2011 | Jo et al. .......................... 710/301 |

(Continued)

*Primary Examiner* — Idriss N Alrobaye
*Assistant Examiner* — Brooke Taylor
(74) *Attorney, Agent, or Firm* — Sawyer Law Group, P.C.

(57) ABSTRACT

A new architecture for use with computer memory storage devices is disclosed that provides means by which a memory storage device may be accessed both as standard archive file device as well as in any unique physical and native command set modes supported by the device. A system architecture for accessing a memory storage device that provides access to the storage device via a standard memory storage method while alternatively providing direct access to the full physical and functional capabilities of the storage device. The system architecture has four main elements. Firstly, a central processing system which acts as the user interface and controls access to all attached peripheral functions. Secondly, an electronic bridge connected on one side to the central processing system via a standard I/O channel and on the other side to the memory device through a memory bridge presenting the memory device to the central processing system as a standard memory peripheral. Thirdly, a second processing unit which on one side is connected to the central processing system and on the other side is connected to the memory storage device via the multiplexer thus providing the second processing unit direct access to the memory storage device. And finally, the multiplexer that can connect either the electronic memory bridge or the second processing system to the memory storage device.

13 Claims, 7 Drawing Sheets

(56) References Cited

U.S. PATENT DOCUMENTS

| | | | |
|---|---|---|---|
| 2004/0059845 A1* | 3/2004 | Choi | 710/36 |
| 2004/0260855 A1* | 12/2004 | Schade | 710/305 |
| 2005/0197017 A1* | 9/2005 | Chou et al. | 439/660 |
| 2005/0251593 A1* | 11/2005 | Lin et al. | 710/62 |
| 2006/0107186 A1 | 5/2006 | Cowell et al. | |
| 2006/0253762 A1* | 11/2006 | Schalick | 714/742 |
| 2007/0005838 A1* | 1/2007 | Chang et al. | 710/62 |
| 2008/0104290 A1 | 5/2008 | Cowell et al. | |
| 2008/0299809 A1 | 12/2008 | Mambakkam et al. | |
| 2008/0301497 A1 | 12/2008 | Chung et al. | |
| 2009/0207743 A1* | 8/2009 | Huq et al. | 370/250 |
| 2009/0210637 A1* | 8/2009 | Yung et al. | 711/154 |

* cited by examiner

MULTIPLE ACCESS TEST ARCHITECTURE FOR MEMORY STORAGE DEVICES

CROSS-REFERENCE TO RELATED APPLICATIONS

This application claims the benefit of U.S. Provisional Application No. 61/082,599, filed Jul. 22, 2008, entitled "DUAL ACCESS TEST ARCHITECTURE FOR MEMORY STORAGE DEVICES," which is incorporated herein by reference in its entirety.

FIELD OF THE INVENTION

The present application relates generally to memory storage devices and more particularly to a test architecture for such devices.

BACKGROUND OF THE INVENTION

Many modern electronic memory storage systems are constructed using an intelligent controller connected to a memory medium. These intelligent memory storage systems often support a number of different physical connections as well as use a variety of function command sets. For the memory storage devices under consideration, a subset of the supported physical interfaces and function command sets often conform to an international standard thus allowing these memory storage systems to be used with low cost personal computers as standard archive file storage drives.

In many cases, memory storage systems are connected to the CPU of the personal computer through an electronic bridge device. An example of such personal computer component is called a USB reader/writer which acts as an electronic bridge between a computer system with USB ports and a memory storage device such as the ones under consideration.

Unfortunately in many cases, the published international standard for the memory storage device is only a subset of the full capabilities of an actual device. Thus, even though the memory storage device can be accessed by a standard computer component such as a USB reader/writer, many of its functional capabilities are often inaccessible due to lack of either the required physical or software interface available in the computer component.

In order to be able to address the many capabilities of modern memory storage devices without the requirement of expensive custom interfaces available in dedicated memory testers, what is required is a new means by which a standard computer can access these devices both as standard archive file devices as well as by using a second interface that allows access to the unique capabilities of these memory devices.

SUMMARY OF THE INVENTION

A system architecture for accessing a memory storage device that provides access to the storage device via a standard memory storage method while alternatively providing direct access to the full physical and functional capabilities of the storage device.

The system architecture has four main elements. Firstly, a central processing system which acts as the user interface and controls access to all attached peripheral functions. Secondly, an electronic bridge connected on one side to the central processing system via a standard I/O channel and on the other side to the memory device through a memory bridge presenting the memory device to the central processing system as a standard memory peripheral. Thirdly, a second processing unit which on one side is connected to the central processing system and on the other side is connected to the memory storage device via a multiplexer thus providing the second processing unit direct access to the memory storage device. And finally, the multiplexer that can connect either the electronic memory bridge or the second processing system to the memory storage device.

DETAILED DESCRIPTION

The present application relates generally to memory storage devices and more particularly to a test architecture for such devices. The following description is presented to enable one of ordinary skill in the art to make and use the invention and is provided in the context of a patent application and its requirements. Various modifications to the preferred embodiments and the generic principles and features described herein will be readily apparent to those skilled in the art. Thus, the present invention is not intended to be limited to the embodiments shown, but is to be accorded the widest scope consistent with the principles and features described herein.

Figure 1:
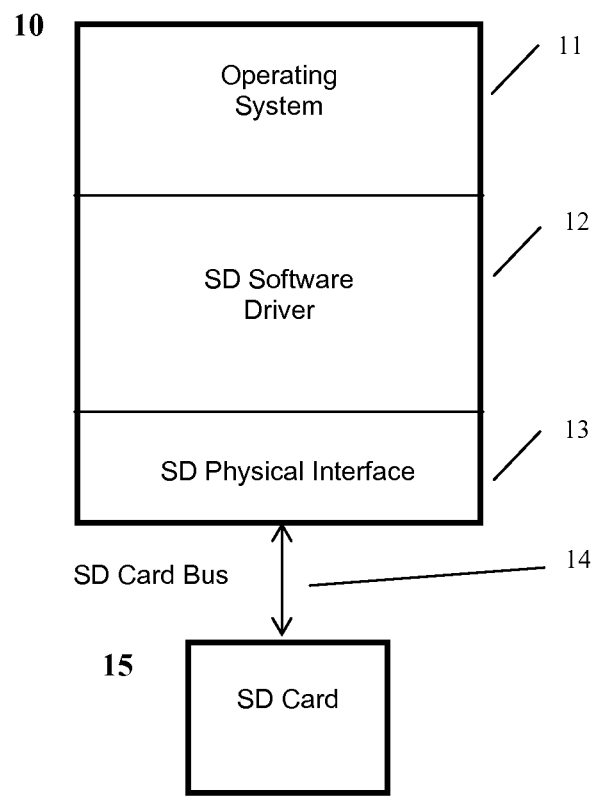
FIG. 1 illustrates the prior art method of connecting an electronic computing device directly to a memory storage device.
Figure 2:
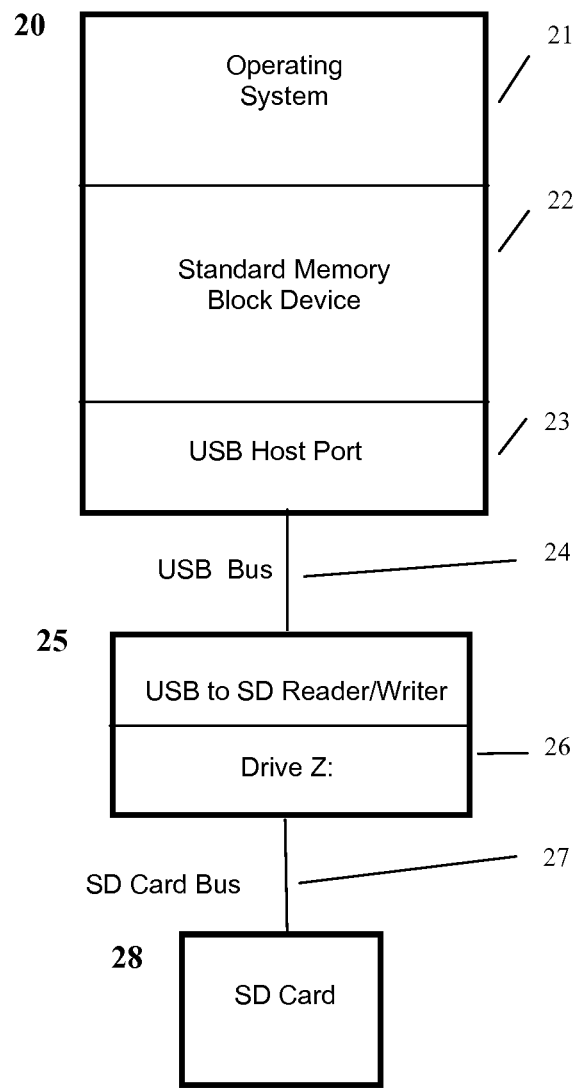
FIG. 2 illustrates the prior art method of connecting a computer to a memory storage device via a memory bridge connection device.
Figure 3:
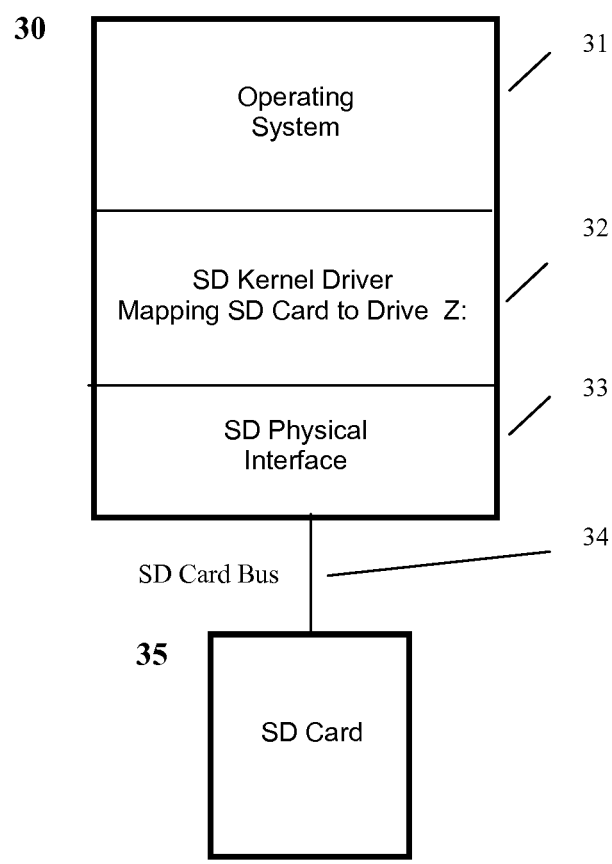
FIG. 3 illustrates the prior art method of connecting a computer directly to the memory storage device, but using a special software driver and special hardware to allow the computer to access all features of the memory storage device.
Figure 4:
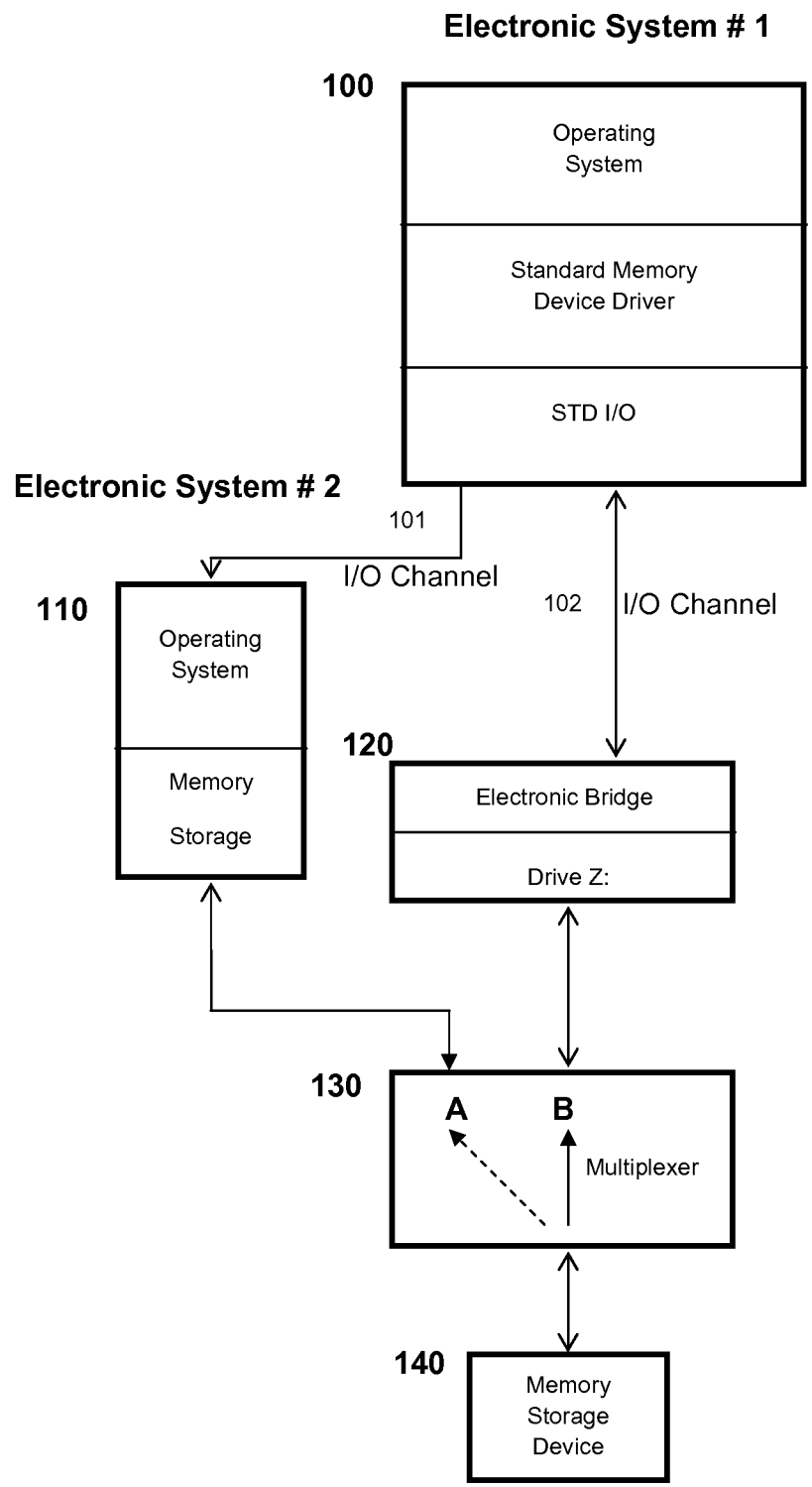
FIG. 4 illustrates the new multiple access memory storage architecture for a single memory storage device.
Figure 5:
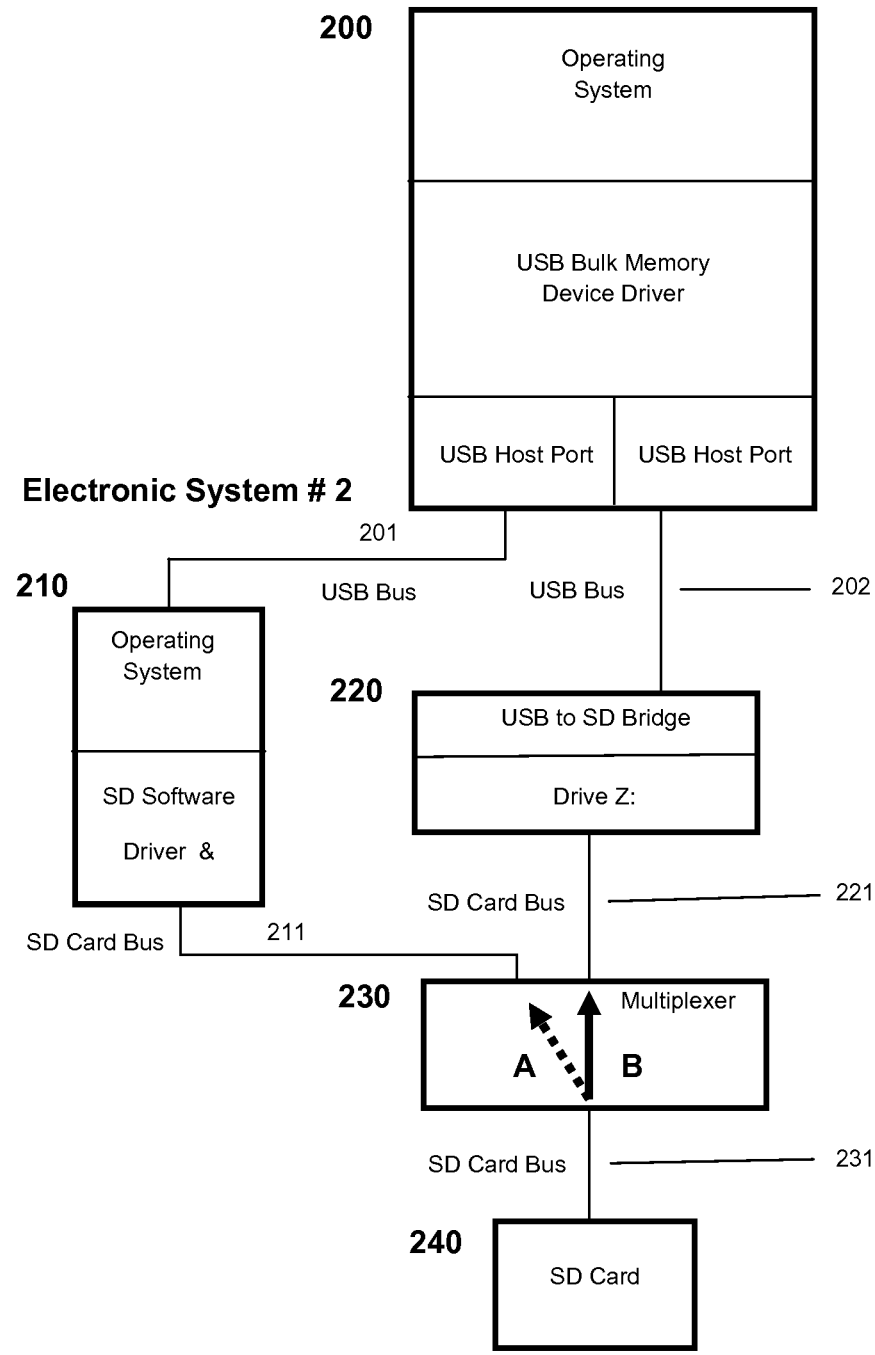
FIG. 5 illustrates one embodiment of the multiple access memory storage architecture; a single socket Flash card tester/duplicator.
Figure 6:
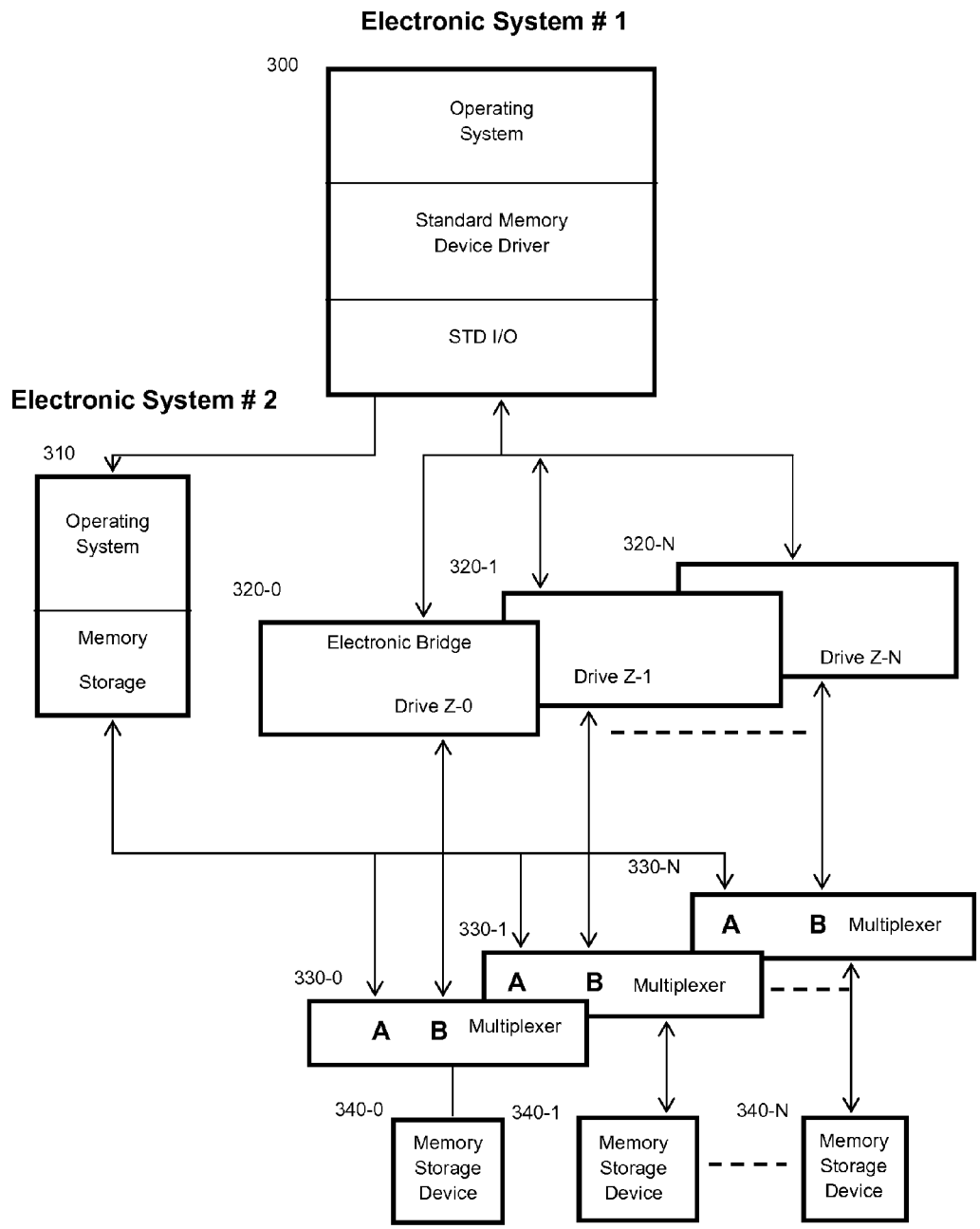
FIG. 6 illustrates another embodiment of the multiple access memory storage architecture; a multi-socket Flash card tester/duplicator.
Figure 7:
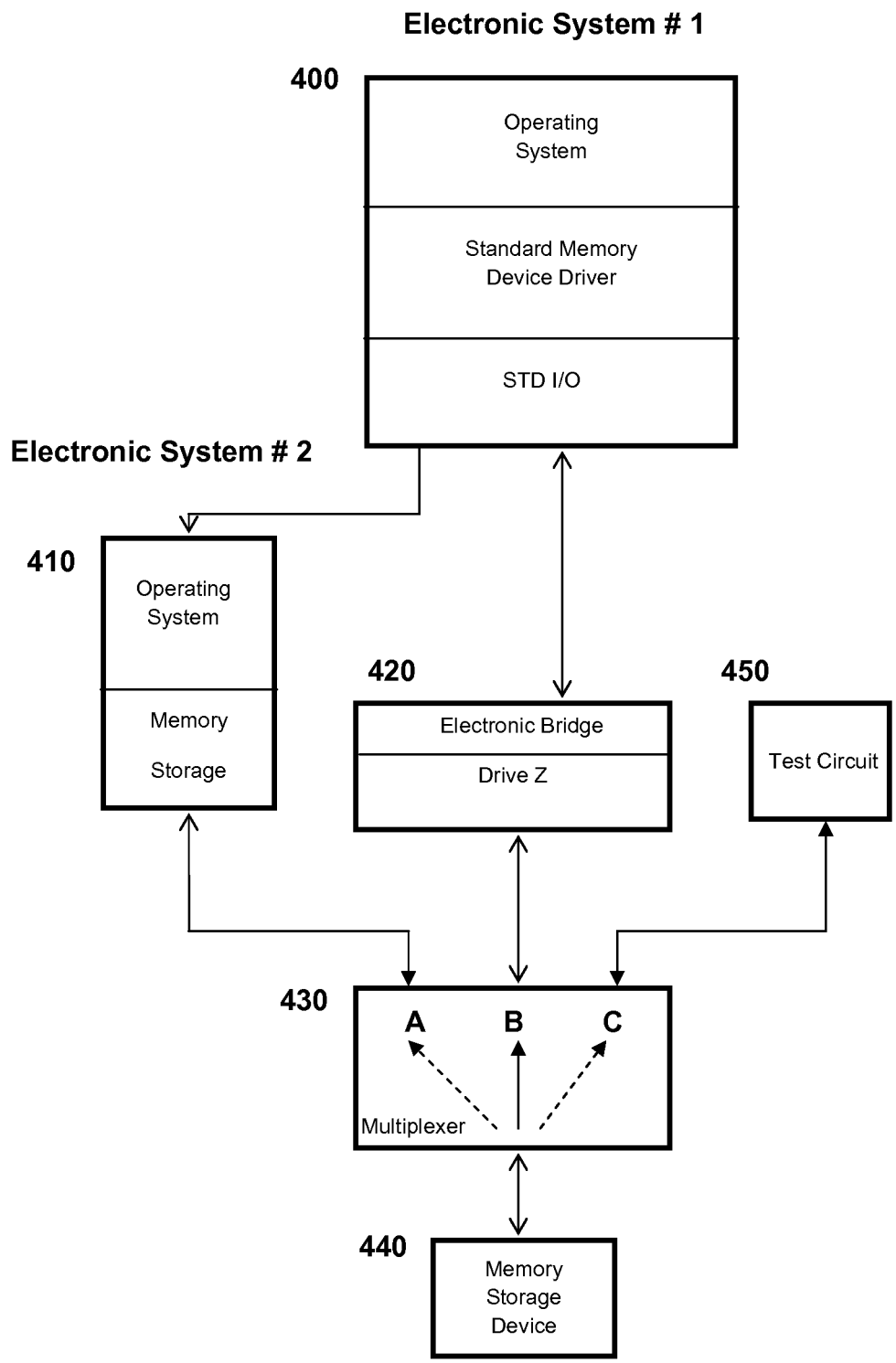
FIG. 7 illustrates another embodiment of the multiple access memory storage architecture; a multi-socket Flash card tester/duplicator with a multiplexer connected to the memory storage device with three or more inputs.

A new architecture for use with computer memory storage devices is proposed that provides means by which memory storage devices may be accessed both in their native command mode as well as by a standard computer memory storage access method. FIGS. 1, 2 and 3 show prior art methods of accessing memory storage devices. FIG. 4 shows the disclosed architecture. FIGS. 5, 6, and 7 shows various embodiments of the new architecture.

FIG. 1 shows a prior art method of connecting an electronic computing system directly to a memory storage device. The computer system 10 is composed of an operating system 11 which includes a software driver 12 specifically made for memory device 15 which in this example is a Flash memory Secure Digital ("SD") card. SD cards are addressed using commands defined by the international standard set by the Secure Digital Association (see www.sdcard.org). Also included in the computer system 10 is a physical interface 13 that is designed specifically for a SD card and is used in conjunction with the SD card bus 14 to connect to SD card 15. In this example, the SD card is not mapped as a general purpose storage device such as a system drive but only as a custom memory device addressable through an SD software driver.

FIG. 2 shows the prior art method of connecting a computer 20 to a memory storage device 28 using a computer bridge component 25. In the example shown, the electronic bridge is a USB reader/writer 25. The memory bridge 25 connects to the computer 20 via a standard USB Bus 24. When a compatible memory storage device 28 such as a SD card is inserted into the bridge 25, the bridge reports to the computer 20 that a standard memory storage device 28 is attached to the computer. The bridge 25 presents the SD card to the computer's operating system 21 as a USB bulk storage device per the USB bulk storage device specification. The computer operating system then maps the USB bulk storage device to a standard file system mass storage drive 26 with label Drive Z.

FIG. 3 shows the prior art method of connecting a computer 30 directly to a memory storage device 35. In this example, the computer includes special software and hardware without the aid of a standard bridge such as a USB reader/writer. The physical connection is the same as in FIG. 1. The computer 30 must provide a custom physical interface 33 to match that of the storage medium. In addition, the computer must include a special software driver (often referred to as a kernel driver) 32 that maps the storage device as a standard operating system drive. The validity of the special software driver is tied both to the specific computer operating system as well as the type of memory card that is being addressed.

With the constant hardware and software modifications occurring in modern electronic products, it has become extremely difficult for electronic instruments such as Flash card testers and Flash card content duplicators to support the ever changing memory storage device market.

What is needed is a system architecture for accessing memory storage devices that provides access to the storage device via a standard memory storage method while alternatively providing direct access to the full physical and functional capabilities of the device. The Multiple Access Test Architecture disclosed in this patent is a solution that provides a practical and low cost means for allowing standard computer systems to fully test and use modern memory storage devices.

FIG. 4 shows one embodiment of the new multiple access memory storage architecture for a single memory storage device. Using I/O channel 101, Electronic System #1, labeled 100, connects to 110, Electronic System #2. Electronic System #1 also connects to a standard memory storage bridge 120 via I/O channel 102. Both Electronic System #2 and the memory storage bridge 120 alternatively connect to the memory storage device 140 through a two position multiplexer, 130. When the switch A/B of the multiplexer is in position A, Electronic System #2 has full physical and full functional access to the memory storage device 140. When the A/B switch of the 130 multiplexer is in position B, Electronic System #1 by way of electronic bridge 120 has access to memory storage device 140 as a standard archival storage medium which in this case is mapped as system Drive Z. The physical control of the A/B switch on the 130 multiplexer may be assigned to either 100, 110, or 120 but is under functional control of the central computer 100.

A specific example of the of the new architecture shown in FIG. 4 is its use in a memory tester/duplicator for Flash memory cards. FIG. 5 shows the new architecture with the memory device being a Flash memory SD card and the electronic bridge being a Flash card USB reader/writer. The example shown in FIG. 5 shows a primary computer system 200 connected to two USB devices; a USB electronic bridge referred to as USB Reader/Writer 220 and a micro computer system 210 that has a USB peripheral port capable of connection to 200 via USB bus 201. The memory storage device 240 is shown as a Secure Digital Flash card (or "SD card" for short). However the architecture of FIG. 5 is applicable to all types of modern memory storage devices.

When the A/B switch on the multiplexer 230 is in the A position, the micro computer 210 has access to the SD card 240 via the physical connection 211 and the multiplexer/SD card bus 231. In this example, the micro computer 210 is capable of addressing the SD card in any of the physical and or functional modes that the manufacturer of the SD card allows including the complete set of commands defined by the SD card standard to which the memory card conforms.

When the A/B switch on the multiplexer 230 is in the B position, the USB memory bridge, 220, presents the SD card 240 to the standard computer 200 as a USB bulk memory device and in this example is mapped as a standard system hard drive shown labeled drive Z.

In FIG. 5, the USB connection 201 between the central CPU 200 and the USB micro computer 210 allows the central CPU to indirectly interface to the SD card 240 via the micro computer 210. The communication channel between the central CPU 200 and the microcomputer 210 is defined by a standard USB class such as a HID class (or Human Interface Device class) that allows information to flow freely between the central CPU 200 and the microcomputer 210.

Now consider the typical requirements of a SD card tester. These include the following capabilities.

a. The SD card tester must be able to control each of the SD card pins.
b. The SD card tester must be able to set physical conditions such as the clock of the SD card to a user defined speed.
c. The SD card tester must be able to send a full list of commands supported by a particular SD card including special commands referred to as vender specific commands.

Normally, none of these functions are supported by USB bridge devices but may certainly be designed as test capabilities of Electronic System #2 in FIG. 5.

In FIG. 5, when the A/B switch of 230 is in position A, the disclosed system architecture provides the manufacturer of the memory storage tester the ability to use special knowledge and information about a particular memory device in order to perform any physical or functional operation on the device which necessary to correctly test the device.

In addition to physically and functionally exercising the memory device as described above, a memory device tester is often required to read and write large blocks data to the memory storage device. These latter requirements are ideally suited for having the memory device 240 connected to Electronic System #1, 200, as a standard memory storage device by having the A/B switch of multiplexer 230 in position B and with the USB to SD bridge device 220 active.

FIG. 6 is a second embodiment that extends the concepts of FIG. 4 and FIG. 5 to multiple memory storage devices connected to a main electronic system which employs multiple electronic bridges and one secondary electronic system. In FIG. 6, secondary electronic system 310 connects directly to the main electronic system 300 via a standard I/O channel. Also connected to the main electronic system 300 are the electronic bridges 320-0, 320-1, . . . , 320-N. The bridges and secondary electronic system 310 connect to the memory storage devices 340-0, 340-1, . . . 340-N via multiplexers 330-0, 330-1, . . . , 330N. Again, the physical control of the A/B switches of multiplexers 330-0, 330-1, . . . , 330-N may assigned to either 300, 310, or 320-N but are always under functional control of the central computer 300.

FIG. 7 is a third embodiment that extends the previous concepts by adding additional inputs to the multiplexer circuit connected to the memory storage device. In FIG. 7 the two position multiplexer has been modified so that the memory storage device is also connected to a test circuit 450 in addition to the bridge device 420 and the secondary computer 410. The test circuit 450 may be as simple as a null device, that is one in which there are no pins. However, having a multiplexer with more than just two positions allows the memory storage devices to be completely disconnected or tested in a manner that is independent of the second computer interface or the bridge circuit interface.

Although not illustrated, a fourth embodiment extends the additional multiplexer input(s) of FIG. 7 to the example of FIG. 5 where multiple storage devices are addressed by a single main computer system. In this embodiment, all multiplexers of FIG. 5 are modified as in FIG. 7 to have an additional multiplexer inputs which provide test features not available with the two input multiplexers of FIG. 5.

Although the present invention has been described in accordance with the embodiments shown, one of ordinary skill in the art will readily recognize that there could be variations to the embodiments and those variations would be within the spirit and scope of the present invention. For example, the I/O channel can be a PCI, PCIE channel or a USB channel or the like and their use would be within the spirit and scope of the present invention. Similarly, the memory storage device can be any of an SD card, compact Flash card, MMC card, MS card, Mini-SD card, and Micro-SD or the like and their use would be within the spirit and scope of the present invention. Accordingly, many modifications may be made by one of ordinary skill in the art without departing from the spirit and scope of the appended claims.

What is claimed is:

1. A system architecture for testing a plurality of memory storage devices comprising:
   a central processing system;
   wherein the central processing system comprises at least a first operating system;
   a plurality of electronic bridges; each of the electronic bridges connected on one side to the central processing system via a standard I/O channel and on the other side to the plurality of memory storage devices through one of a plurality of multiplexers with the plurality of electronic bridges presenting the plurality of memory storage devices to the central processing system as standard memory peripherals;
   and a second processing system which on one side is connected to the central processing system and on the other side is connected to the plurality of memory storage devices via the plurality of multiplexers thus providing the second processing system direct access to the plurality of memory storage devices, wherein the second processing system comprises at least a second operating system and a mechanism for fully testing the command set of the plurality of memory storage devices, wherein one of the plurality of multiplexers alternatively connects one of the plurality of electronic bridges to one of the plurality of memory storage devices or the second processing system to one of the plurality of memory storage devices.

2. The system architecture of claim 1 wherein the standard I/O channel between the plurality of electronic bridges and the central processing system is a USB channel.

3. The system architecture of claim 1 wherein the standard I/O channel between the plurality of electronic bridges and the central processing system is a PCI channel.

4. The system architecture of claim 1 wherein the standard I/O channel between the plurality of electronic bridges and the central processing system is a PCIE channel.

5. The system architecture of claim 1 where the plurality of memory storage devices are SD cards.

6. The system architecture of claim 1 where the plurality of memory storage devices are compact Flash cards.

7. The system architecture of claim 1 where the plurality of memory storage devices are MMC cards.

8. The system architecture of claim 1 where the plurality of memory storage devices are MS cards.

9. The system architecture of claim 1 where the plurality of memory storage devices are Mini-SD cards.

10. The system architecture of claim 1 where the plurality of memory storage devices are micro SD cards.

11. The system architecture of claim 1 wherein one of the plurality of multiplexers connected to the plurality of memory storage devices may have a plurality of inputs including a connection to the second processing system, one of the plurality of electronic bridges, and any additional inputs needed to fully power sequence or test the plurality of memory storage devices as desired by the central processing system.

12. The system architecture of claim 1 wherein the second processing system and the plurality of multiplexers connected to the plurality of memory storage devices are on removable modules.

13. The system architecture of claim 12 wherein each removable module is specifically made to support different types of memory storage devices thus creating a universal tester/duplicator for memory storage devices.

* * * * *